(12) United States Patent
Montoye et al.

(10) Patent No.: US 7,349,288 B1
(45) Date of Patent: Mar. 25, 2008

(54) ULTRA HIGH-SPEED NOR-TYPE LSDL/DOMINO COMBINED ADDRESS DECODER

(75) Inventors: Robert Kevin Montoye, New York, NY (US); Yutaka Nakamura, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/538,877

(22) Filed: Oct. 5, 2006

(51) Int. Cl.
*G11C 8/00* (2006.01)
(52) U.S. Cl. .............. 365/230.06; 365/230.08
(58) Field of Classification Search .......... 365/230.06, 365/230.08, 190, 156, 240; 326/95–98, 115
See application file for complete search history.

(56) References Cited

U.S. PATENT DOCUMENTS

| 6,316,961 | B2 * | 11/2001 | Kanetani et al. | ........... 326/98 |
| 6,333,645 | B1 * | 12/2001 | Kanetani et al. | ........... 326/98 |
| 6,842,394 | B2 * | 1/2005 | Kanetani et al. | ....... 365/230.06 |
| 7,239,565 | B2 * | 7/2007 | Liu | ............ 365/203 |
| 7,242,629 | B2 * | 7/2007 | Luk et al. | ............ 365/205 |

OTHER PUBLICATIONS

Takamaro Kikkawa, "Advanced Interconnect Technologies for ULSI Scaling," *ICVC*, Oct. 1999, pp. 202-207.
Mark T. Bohr, "Interconnect Scaling—The Real Limiter to High Performance ULSI," *IEDM*, Dec. 1995, pp. 241-244.
Hiroaki Nambu, et al., "A 1.8-ns Access, 550-MHz, 4.5-Mb CMOS SRAM," *IEEE Journal of Solid-State Circuits*, vol. 33, No. 11, Nov. 1998, pp. 1650-1658.
Robert Montoye et al., "A Double Precision Floating Point Multiply," *IEEE International Solid-State Circuits Conference*, Feb. 2003, pp. 336-337.
Wendy Belluomini, et al., "An 8Ghz Floating-Point Multiply," *IEEE International Sold-State Circuits Conference*, Feb. 2005, pp. 374-374.

* cited by examiner

*Primary Examiner*—Anh Phung
*Assistant Examiner*—Hien Nguyen
(74) *Attorney, Agent, or Firm*—Casimer K. Salys; Winstead PC

(57) ABSTRACT

An ultra high speed address decoder uses a combination of Domino logic circuits and LSDL logic circuits. N address bits are converted into N logic true address bits and N complementary address bits. A partial address decoder generates two bit groups using selected of the N logic true address bits and N complementary address bits in NOR logic structures such only two cascaded NFETS are used in a logic tree. The bit groups are partitioned to optimize the layout of the parallel bit lines in the address decoder.

20 Claims, 15 Drawing Sheets

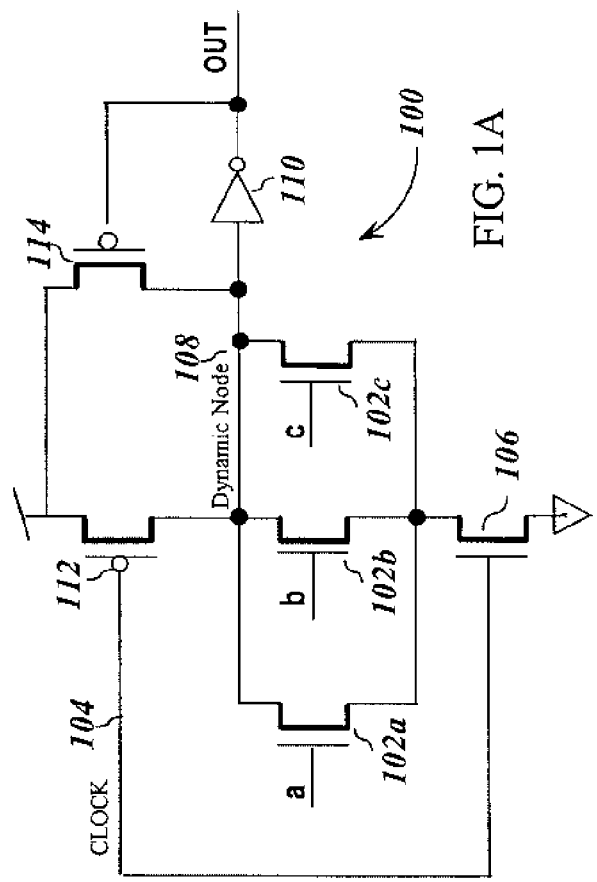
FIG. 1A
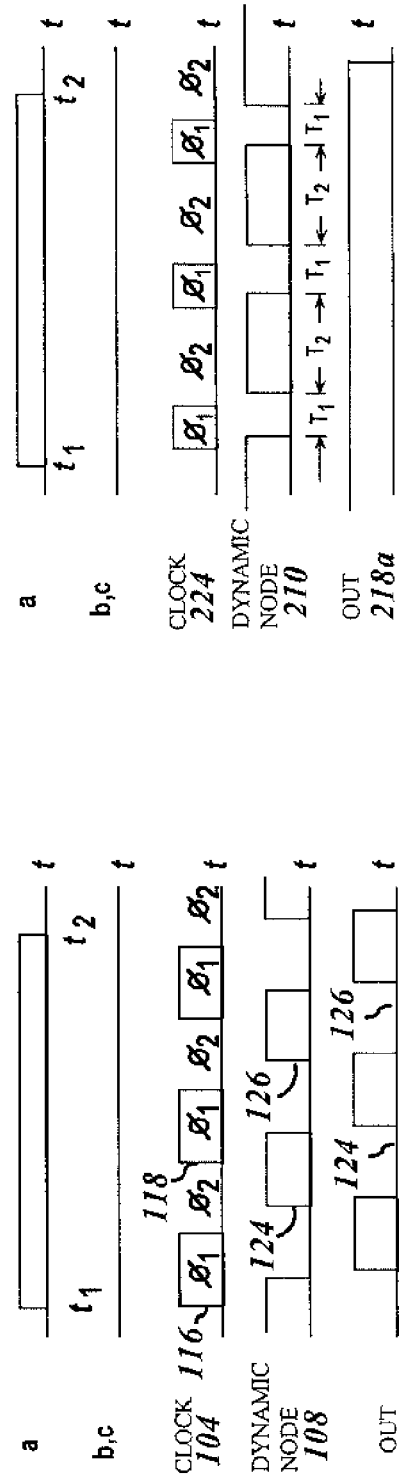
FIG. 2D
FIG. 1B

Part of Address Decoder
300

Part of Address Decoder
300

Part of Address Decoder

Part of Address Decoder

Part of Address Decoder

Part of Address Decoder

Part of Address Decoder

Part of Address Decoder

ULTRA HIGH-SPEED NOR-TYPE LSDL/DOMINO COMBINED ADDRESS DECODER

TECHNICAL FIELD

The present invention relates to ultra high speed address decoders using dynamic logic circuits, and in particular, to address decoders employing partial decoders and word-line drivers for addressing a group of registers.

BACKGROUND INFORMATION

Modern data processing systems may perform Boolean operations on a set of signals using dynamic logic circuits. Dynamic logic circuits are clocked. During the precharge phase of the clock, the circuit is preconditioned, typically, by precharging an internal node (dynamic node) of the circuit by coupling to a power supply rail. During an evaluate phase of the clock, the Boolean function being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock each cycle may consume power even when the logical value of the output is otherwise unchanged.

This may be appreciated by referring to FIG. 1A illustrating an exemplary three-input OR dynamic logic gate and the accompanying timing diagram, FIG. 1B. This type of logic gate is referred to in the literature as a Domino logic gates since state changes ripple through cascaded circuits when the clock signal evaluates the dynamic node like "Dominos" falling.

Dynamic logic 100, FIG. 1A, includes three inputs a, b and c coupled to a corresponding gate of NFETs 102a-102c. During an evaluate phase of clock 104, $N_1$, NFET 106 is active, and if any of inputs a, b or c are active, dynamic node 108 is pulled low, and the output OUT goes "high" via inverter 110. Thus, referring to FIG. 1B, which is illustrative, at $t_1$ input a goes high during a precharge phase $N_2$ of clock 104. During the precharge phase $N_2$ of clock 104, dynamic node 108 is precharged via PFET 112. Half-latch PFET 114 maintains the charge on dynamic node 108 through the evaluate phase, unless one or more of inputs a, b or c is asserted. In the illustrative timing diagrams in FIG. 1B, input a is "high" having a time interval $t_1$ through $t_2$ that spans approximately 2½ cycles of clock 104, which includes evaluation phases, 116 and 118. Consequently, dynamic node 108 undergoes two discharge-precharge cycles, 124 and 126. The output node similarly undergoes two discharge-precharge cycles, albeit with opposite phase, 124 and 126. Because the output is discharged during the precharge phase of dynamic node 108, even though the Boolean value of the logical function is "true" (that is, "high" in the embodiment of OR gate 100) the dynamic logic dissipates power even when the input signal states are unchanged.

Additionally, dynamic logic may be implemented in a dual rail embodiment in which all of the logic is duplicated, one gate for each sense of the data. That is, each logic element includes a gate to produce the output signal, and an additional gate to produce its complement. Such implementations may exacerbate the power dissipation in dynamic logic elements, as well as obviate the area advantages of dynamic logic embodiments.

Selection circuits, including shifting circuits and multiplexors, are used extensively within computer systems. Some of these selection circuits require multiple levels of selection, for example, a first input is selected from a plurality of first inputs wherein each of the first inputs are additionally selected from a plurality of second inputs. Computer systems employing dynamic logic may find that it is difficult to implement selection circuits for single and multilevel selection from many inputs because of the limitations of required precharge and evaluation times as well as the fact that outputs are not held during the precharge cycle.

Limited switching dynamic logic (LSDL) circuits produce circuits which mitigate the dynamic switching factor of dynamic logic gates with the addition of static logic devices which serve to isolate the dynamic node from the output node. Additionally, LSDL circuits and systems maintain the area advantage of dynamic logic over static circuits, and further provide both logic senses, that is, the output value and its complement.

Rapid performance increases and multi-functionality of microprocessors require larger entry register files that operate at higher speeds. Address decoding consumes approximately >50% of the overall operation time when accessing these register files, therefore improving address decoding speed must be a priority to continue improving microprocessor performance.

Using Partially-Depleted Silicon-On-Insulator (PDp-SOI) technology and an exemplary 8 GHz (120 ps]) operating frequency and pipeline operation, only one 120 ps clock cycle is allocated for capturing addresses, partial decoding, and selecting/de-selecting a word-line (WL). A total of two clock cycles are necessary to read/write and provide primary/secondary sensing. Output data driving consumes an additional clock cycle. Scaling CMOS technology below 100 nm has continued to improve transistor performance while PDp-SOI technology has achieved further improvement due to low junction capacitance and absence of the "body effect." However, interconnect performance has been degrading since the feature sizes have dropped below 0.5 um. Smaller transistors has enabled compaction of layout area and has resulted in shorter interconnect wire, however, the wire pitch has also been further reduced. This has resulted higher RC time constants even with the use of copper instead of aluminum and the used of low-k interlayer dielectrics materials. At least 20 ps of the timing margin is consumed by the propagation delays in each of the word-lines and the partial decoder lines even if a compact layout is prepared and the line lengths are optimized to reduce wire delay. As a result, only two thirds (e.g., 80 ps) may be allotted for capturing addresses (true/complement generation), partial decoding, and selecting/de-selecting a word-line. Therefore, there is a need for circuitry to improve address decoder performance that will allow improvements in microprocessor performance.

SUMMARY OF THE INVENTION

The invention offers a scheme to make an ultra high-speed Address Decoder generating $2^N$ address lines from N address bits by combining both NOR-type Limited Dynamic Switch Logic (LSDL) and NOR-type Domino Logic to implement a Partial Decoder (PD) portion of the Address Decoder. The PD circuitry is partitioned into a first and second circuit group. The first circuit group receives M of the N address bits and generates $P=2^M$ bits and is implemented in NOR-type LSDL logic gates. The second group receives (N–M) of the N address bits and generates $K=2^{N-M}$ bits and is implemented in NOR-type Domino logic. Since LSDL has lower power dissipation than Domino, the partition is chosen such that P is greater than K. This enables the speed of dynamic logic to be realized without the power of a total Domino implementation.

The word-line (WL) Drivers are configured as K groups of P drivers wherein each of the P drivers has an input receiving one of the P bits from the first circuit group and has a common node gated by a same one of the bits from the K bits generated by the second circuit group. This generates the P times $K=2^N$ word-lines. Since the K groups of P drivers are each gated by a Domino driven bit line, each word-lines is thus gated by the Domino circuit clock and is only active for one-half clock cycle and OFF for the second-half clock cycle. Only one clock phase is needed for the Address Decoder and having P drivers gated by a common bit line reduces layout area and increases WL driver speed. Having no more that two cascaded NFETS in the logic gates, using a single clock phase, and implementing the logic using a combination of LSDL and Domino dynamic logic gates enables an ultra high speed Address Decoder.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof reference is now made to the following descriptions taken in conjunction with the accompanying drawings in which:

FIG. 1A illustrates, in partial schematic form, a dynamic logic gate which may be used in conjunction with the present invention;

FIG. 1B illustrates a timing diagram corresponding to the logic gate embodiment illustrated in FIG. 1A;

FIG. 2D illustrates a timing diagram corresponding to an embodiment of the dynamic logic device of FIG. 2A in which the logic function performed is the logical OR of three input signals;

DETAILED DESCRIPTION

Figure 2A:
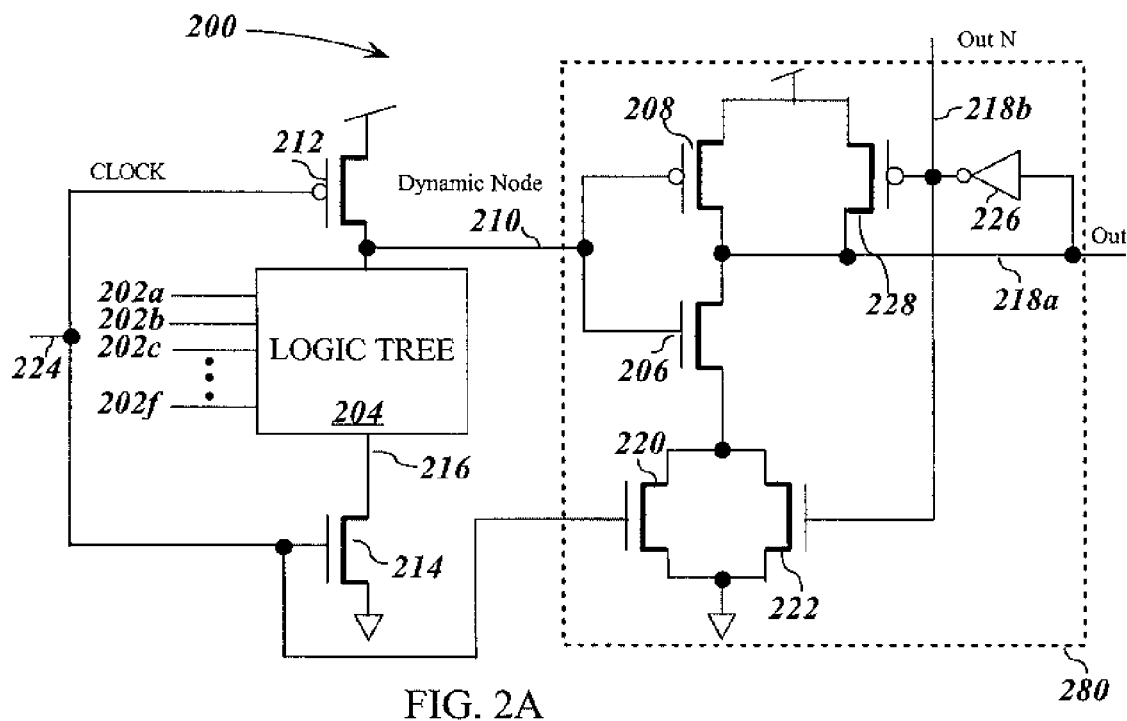
FIG. 2A illustrates, in partial schematic form, a standard LSDL device illustrating the static logic devices for isolating the dynamic node from the output node.

In the following description, numerous specific details are set forth to provide a thorough understanding of the present invention. For example, specific logic functions and the circuitry for generating them may be described; however, it would be recognized by those of ordinary skill in the art that the present invention may be practiced without such specific details. In other instances, well-known circuits have been shown in block diagram form in order not to obscure the present invention in unnecessary detail. Refer now to the drawings wherein depicted elements are not necessarily shown to scale and wherein like or similar elements are designated by the same reference numeral by the several views.

FIG. 2A illustrates a limited switch dynamic logic (LSDL) device 200 suitable for use in embodiments of the present inventive principles. In general, LSDL device 200 receives a plurality, n, of inputs 202a . . . 202d provided to logic tree 204, and outputs a Boolean combination of the inputs. The particular Boolean function performed by LSDL device 200 is reflected in the implementation of logic tree 204 (accounting for the inversion performed by the inverter formed by n-channel field effect transistor (NFET) 206 and p-channel field effect transistor (PFET) 208). Logic tree 204 is coupled between the drain of PFET 212 and the drain of NFET 214, node 216. The junction of the logic tree 204 and the drain of PFET 212 forms dynamic node 210.

Figure 2B:
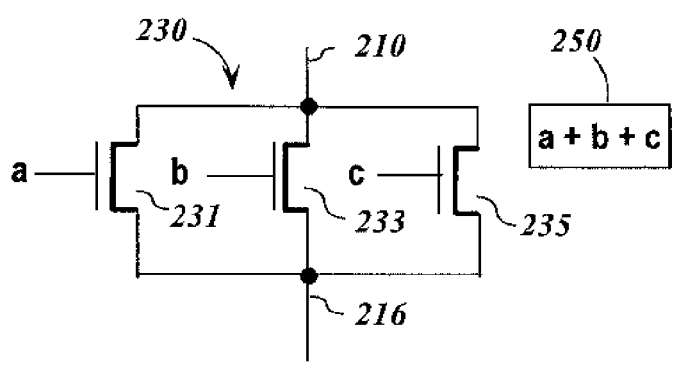
FIG. 2B illustrates, in partial schematic form, circuitry for incorporation in the logic tree of FIG. 2A whereby the logic function performed is the logical OR of three input signals.
Figure 2C:
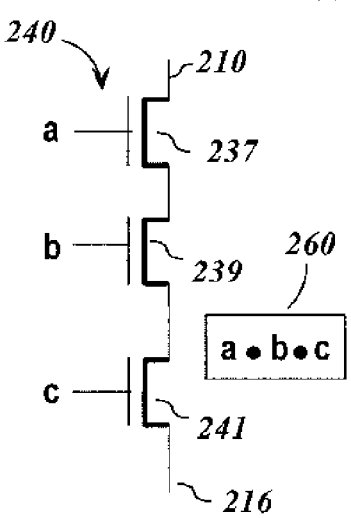
FIG. 2C illustrates, in partial schematic form, another circuit for incorporation in the logic tree of FIG. 2A whereby the logic function performed is the logical AND of three input signals.

For example, FIG. 2B illustrates logic tree 230 including three parallel connected NFETs, 231, 233 and 235. Logic tree 230 may be used to provide a logic device generating the logical NOR of the three input signals coupled to corresponding ones of the gates of NFETs 231, 233 and 235, a, b and c (as indicated by the Boolean expression 250 in FIG. 2B) and accounting for the inversion via NFET 206 and PFET 208. Similarly, FIG. 2C illustrates a logic tree 240 including three serially connected NFETs 237, 239 and 241. Logic tree 240 may be used in conjunction with the logic device 200 to generate the logical NAND of the three input signals a, b and c (as indicated by the Boolean expression 260 in FIG. 2C).

Returning to FIG. 2B, dynamic node 210 is coupled to the common junction of the gates of NFET 206 and PFET 208 which invert the signal on dynamic node 210. The inversion of the signal on dynamic node 210 is provided on Out 218a.

The transistor pair, 206 and 208, is serially coupled to parallel NFETs 220 and 222. NFET 220 is switched by clock signal 224. Thus, during the evaluate phase of clock signal 224, the inverter pair, NFET 206 and PFET 208 are coupled between the supply rails by the action of NFET 220.

The operation of LSDL device 200 during the evaluate phase, $N_1$, may be further understood by referring to FIG. 2D illustrating an exemplary timing diagram corresponding to the dynamic logic circuit of FIG. 2A in combination with a logic tree embodiment 230 of FIG. 2B. In this way, for purposes of illustration, the timing diagram in FIG. 2D is the counterpart to the timing diagram in FIG. 1B for the three-input OR gate 100 depicted in FIG. 1A. As shown, input a is "high" or "true" between $t_1$ and $t_2$. In the evaluate phase, $N_1$ of clock signal 224, dynamic node 210 is pulled down (intervals $T_1$). In these intervals, Out 218a is held high by the action of the inverter formed by transistors 206 and 208, which inverter is active through the action of NFET 220 as previously described. In the intervening intervals, $T_2$, dynamic node 210 is pulled up via the action of the precharge phase, $N_2$ of clock signal 224, and PFET 212. In these intervals, the inverter is inactive as NFET 220 is off. Out 218a is held "high" by the action of inverter 226 and PFET 228. Note also that the output of inverter 226 may provide a complementary output, Out N 218b. (Thus, with respect to the three-input logic trees in FIGS. 2B and 2C, the corresponding logic device represents a three-input OR gate and a three-input AND gate, respectively.)

Returning to FIG. 2A, if the logic tree evaluates "high", that is the Boolean combination of inputs 202a . . . 202d represented by logic tree 204, evaluate high, whereby dynamic node 210 maintains its precharge, Out 211a is discharged via NFET 206 and NFET 220. In the subsequent precharge phase, $N_2$, of clock signal 224, Out 218a is latched via the action of inverter 226 and NFET 222. Thus, referring again to FIG. 2D, corresponding to the three input OR embodiment of logic device 200 and logic tree 230 (FIG. 2B) at $t_2$ input a falls, and in the succeeding evaluate phase of clock signal 224, dynamic node 210 is held high by the precharge. The inverter pair, NFETs 206 and 208, are active in the evaluate phase of $N_1$, of clock signal 224 because of the action of NFET 220. Consequently, Out 218a falls ($t_3$). In the succeeding precharge phase, $N_2$ of clock signal 224, Out 218a is latched in the "low" state, as previously described.

In this way, LSDL device 200 in FIG. 2A, may provide a static switching factor on Out 218a, and likewise with respect to the complementary output Out N 218b. Note too, as illustrated in the exemplary timing diagram in FIG. 2D, the duty factor of the clock signal may have a value that is less than fifty percent (50%). In such an embodiment, the evaluate phase, $N_1$, of the clock signal may be shorter in duration than the precharge phase, $N_2$. A clock signal having a duty factor less than fifty percent (50%) may be referred to as a pulse (or pulsed) clock signal. A width of the evaluate phase may be sufficiently short that leakage from the dynamic node may be inconsequential. That is, leakage does not affect the evaluation of the node.

In such a clock signal embodiment, the size of the precharge device (PFET 212 in the embodiment of FIG. 2A) may be reduced. It would be recognized by those of ordinary skill in the art that a symmetric clock signal has a fifty percent (50%) duty cycle; in an embodiment in which the duty cycle of the clock signal is less than fifty percent (50%), the size of the precharge device may be reduced concomitantly. In particular, an embodiment of the present invention may be implemented with a clock signal duty cycle of approximately thirty percent (30%). Additionally, while logic device 200 has been described from the perspective of "positive" logic, alternative embodiments may be implemented in the context of "negative" logic.

To understand the methods for improving Address Decoder performance, the general problem is considered by showing typical circuits and their performance limits. In the following, an 8 bit address decoder is used to illustrate embodiments of the present invention. Larger address buses may be used and are considered within the scope of the present invention.

Nomenclature as a<7:0> indicates an address a that includes 8 bits 0-7. The following assumes the use of address decoding comprising 3 basic blocks; a true/complement generator (TCG) that produces the 8 address bits and their complements, a partial decoder (PD) that inputs the 8 bit address and the 8 complement address bits and outputs bit groups, for example, two 8 bit groups y<7:0> and z<7:0> and one 4 bit group w<3:0>. These three exemplary bit groups have 8×8×4=256 combinations which equals the number of register positions addressable by an 8 bit address. Finally, a word line (WL) driver is used to convert the group bits into 256 word lines WL<0:255>. Optimizing address decoding to improve the speed of this function may require circuit as well as layout optimization as a significant portion of the timing budget may be used in wiring delays.

Figure 3A:
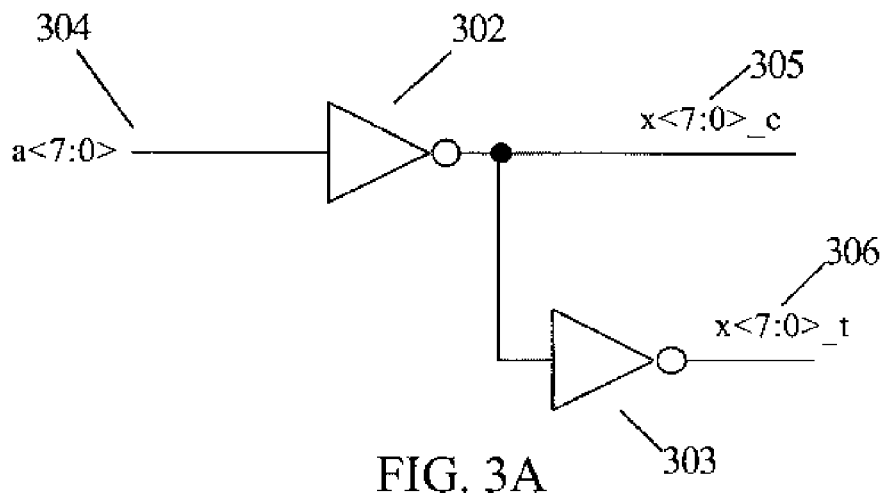
FIG. 3A is a circuit of a true-complement generator suitable for use with the present invention.
Figure 3C:
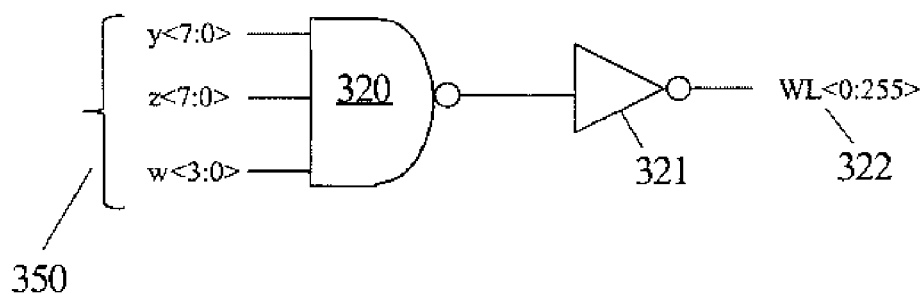
FIG. 3C is a circuit diagram of a partial decoder.
Figure 3B:
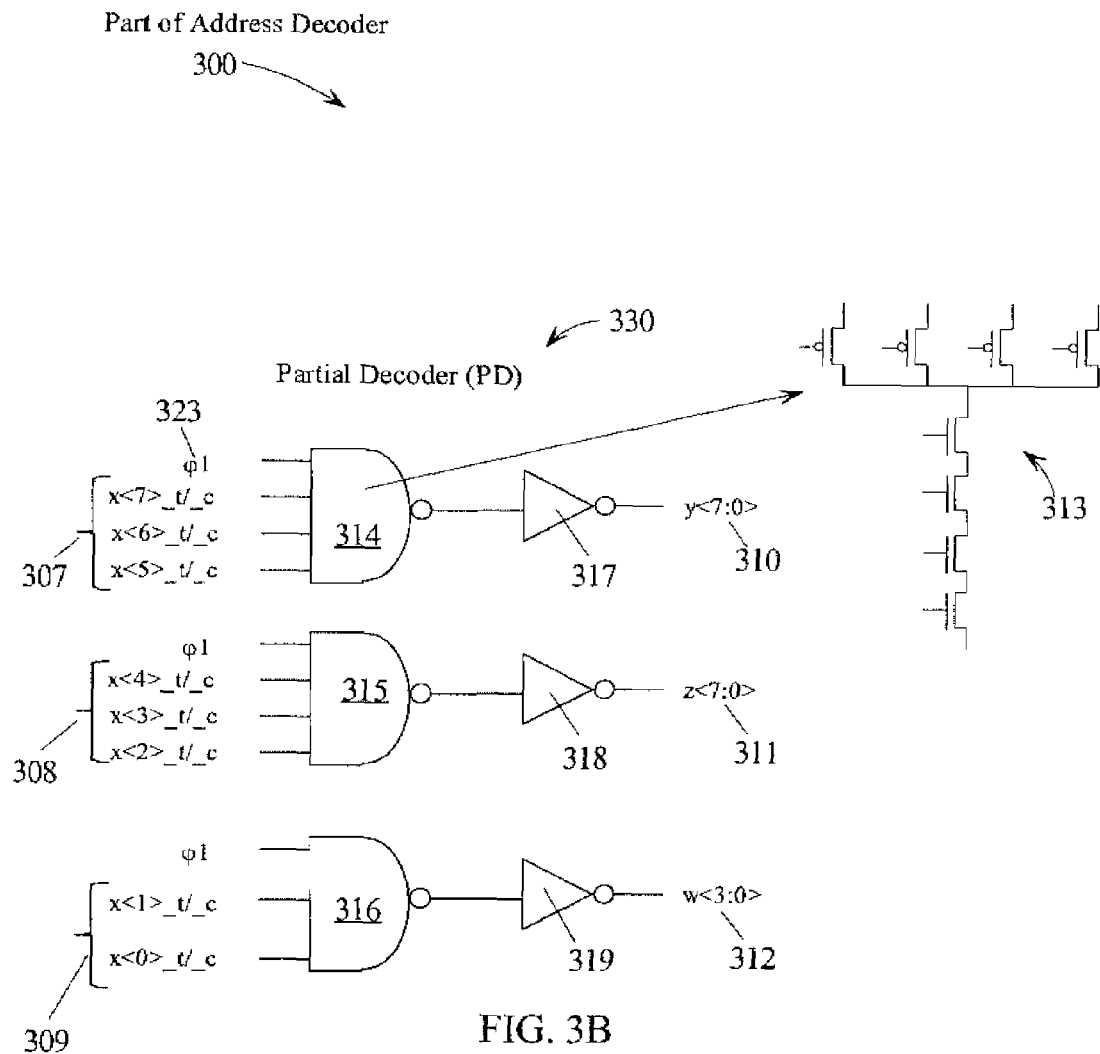
FIG. 3B is a circuit diagram of a word line driver.

The circuitry for implementing a conventional 8 bit address decoder 300 using conventional static logic gates (e.g., CMOS) is described relative to FIGS. 3A-3C.

FIG. 3A is a circuit diagram illustrating a true/complement logic generator (TCG) 301 for producing 8 true address bits x<7:0>_t 306 and 8 complement address bits x<7:0>_c 305. FIG. 3A implies that there are 8 sets of inverters 302 and 303, coupled as shown, each receiving an address bit and generating its true state and its complement state. The circuit schematic of FIG. 3A is a short hand way of representing an 8 bit TCG 301. An exemplary circuit (inverters 302 and 303) receives a<7:0> 304 and outputs true address bits x<7:0>_t 305 and complement address bits x<7:0>_c 306. TCG 301 generates at least one inverter delay between the true and complement outputs which will reduce the setup/hold timing margin relative to clock phase 323 in the partial decoder 330 described relative to FIG. 3B.

FIG. 3B is a circuit diagram of a typical MOS partial decoder (PD) 330 that receives combinations of true address bits x<7:0>_t 305 and complement address bits x<7:0>_t 305 and generates the 8 bit groups y<7:0> 310 and z<7:0> 311 and the 4 bit group w<3:0> 312. The 8 bit group y<7:0> 310 is produced by combinations of the 3 high order bits x<7:5>_t of x<7:0>_t 305 and the 3 high order bits x<7:5>_c of x<7:0>_c 304 coupled to the set of 8 AND gates formed by 8 NAND gates 314 and 8 inverters 317. These combinations are shown as 307 using the short hand nomenclature x<7>_t/_c, x<6>_t/_c and x<5>_t/_c which indicate that the true bit (e.g., x<7>_t) is used when its logic one state is desired in a logic combination and the complement bit (e.g., x<7>_c) is used when its logic zero state is desired in a logic combination. Circuit 313 illustrates the MOS structure of the NAND gate 314. Clock phase 323 is used to gate the outputs so that they are valid for one-half a cycle which is desired in pipeline architectures using the Address Decoder 300.

The 8 bit group z<7:0> 311 is produced by logic combinations of the next 3 bits x<4:2>_t from x<7:0>_t 305 and x<4:2>_c from x<7:0>_t 306. These combinations produce the 8 true states of z<7:0> 311 in the set of 8 AND gates formed by 8 NAND gates 315 and 8 inverters 318. These combinations are shown as 308 using the short hand nomenclature x<4>_t/_c, x<3>_t/_c, and x<2>_t/_c. The use of a 4-stage cascaded NMOS in the 4-input NAND of conventional PD 330 degrades speed significantly. High speed operation requires no more than 2 cascaded NMOS devices in the logic gates to enable an address encoder to operate at ultra high speed (e.g., 8 GHz).

The 3 bit group w<3:0> 312 is produced by logic combinations of the lower 2 bits x<1:0>_t from x<7:0>_t 305 and x<1: >_c from x<7:0>_t 306 in the set of 4 AND gates formed by 4 NAND gates 316 and 4 inverters 319. These logic combinations are shown as 309 using the short hand nomenclature x<1>_t/_c and x<0>_t/_c.

FIG. 3C illustrates WL Drivers 340 that drive 256 word-lines WL<0:255> 322. NAND gate 320 and inverter 321 are one of 256 circuits needed to produce the word-lines WL<0: 255> 322. In this manner, the combinations 350 comprising y<7:0> 310, z<7:0> 311, w<3:0> 312 generate the 256 word lines WL<0:255> 322 for addressing 256 registers. Again, the NAND 320 requires more than a 2-stage cascaded NMOS (in this case 3-stages) which significantly reduces performance.

TCG 301 has at least one inverter delay timing difference between the true address bits x<7:0>_t 306 and 8 complement address bits x<7:0>_c 305. This timing difference reduces setup/hold timing margin of clock 323 used in the partial decoder 330 and WL driver 340 and causes significant speed degradation in the address decode function. For ultra high speed operation (e.g., 8 GHz), it is necessary to reduce the timing delay through the cascaded NMOS stages in both the circuitry of PD 330 and WL Driver 340 to assure the operation is completed within 80 ps. In general, the most effective way to speed up circuit performance is to convert from static logic circuitry to dynamic logic circuitry even though power consumption increases. Further reducing the number of cascaded NMOS stages in the logic gates requires using gates with NOR functionality instead of NAND.

Figure 4A:
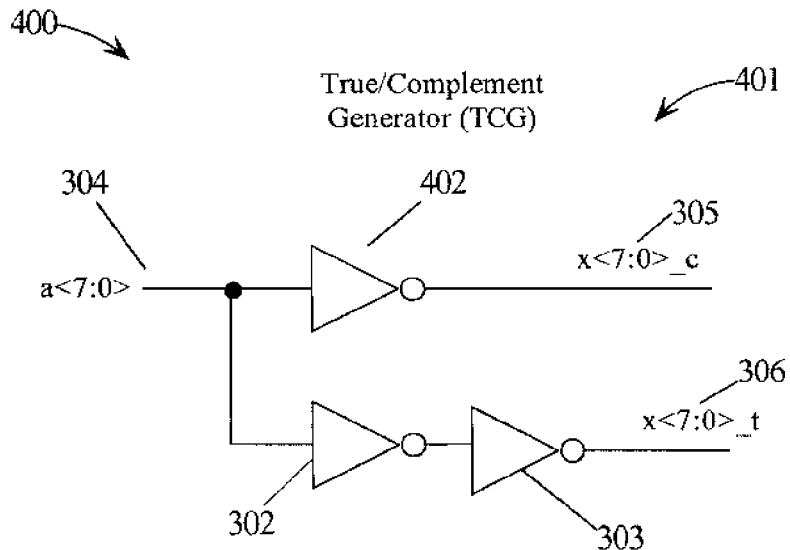
FIG. 4A is another circuit of a true-complement generator suitable for use with the present invention.
Figure 4C:
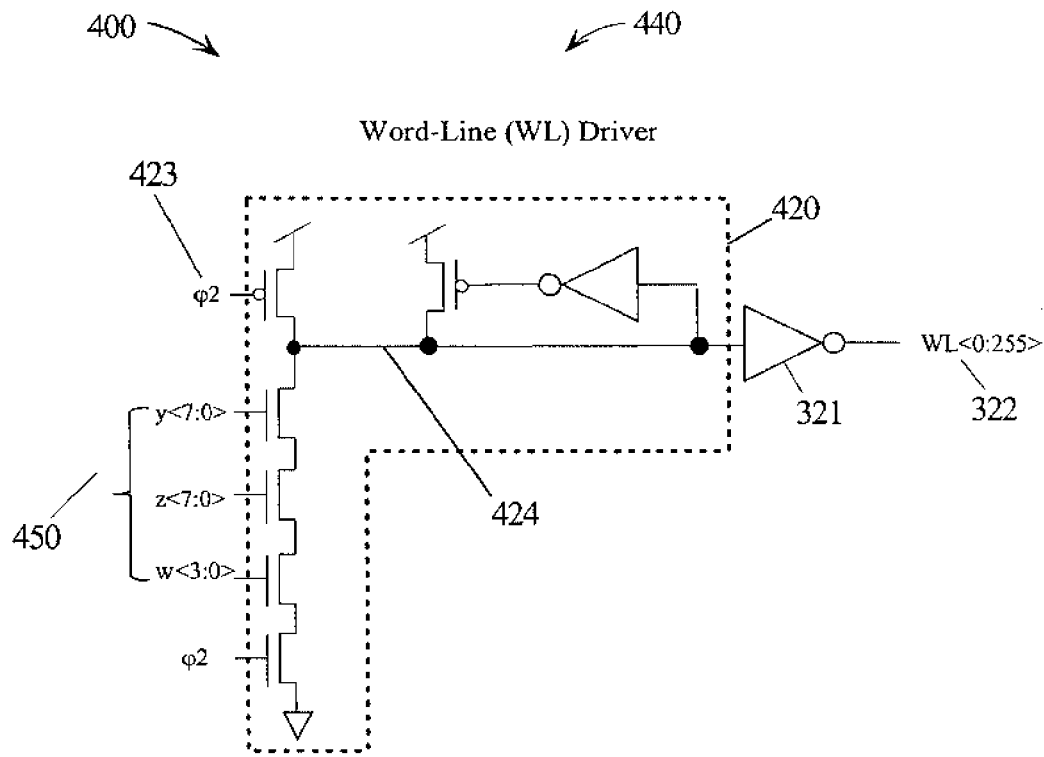
FIG. 4C is a circuit block diagram of circuits in another partial decoder.
Figure 4B:
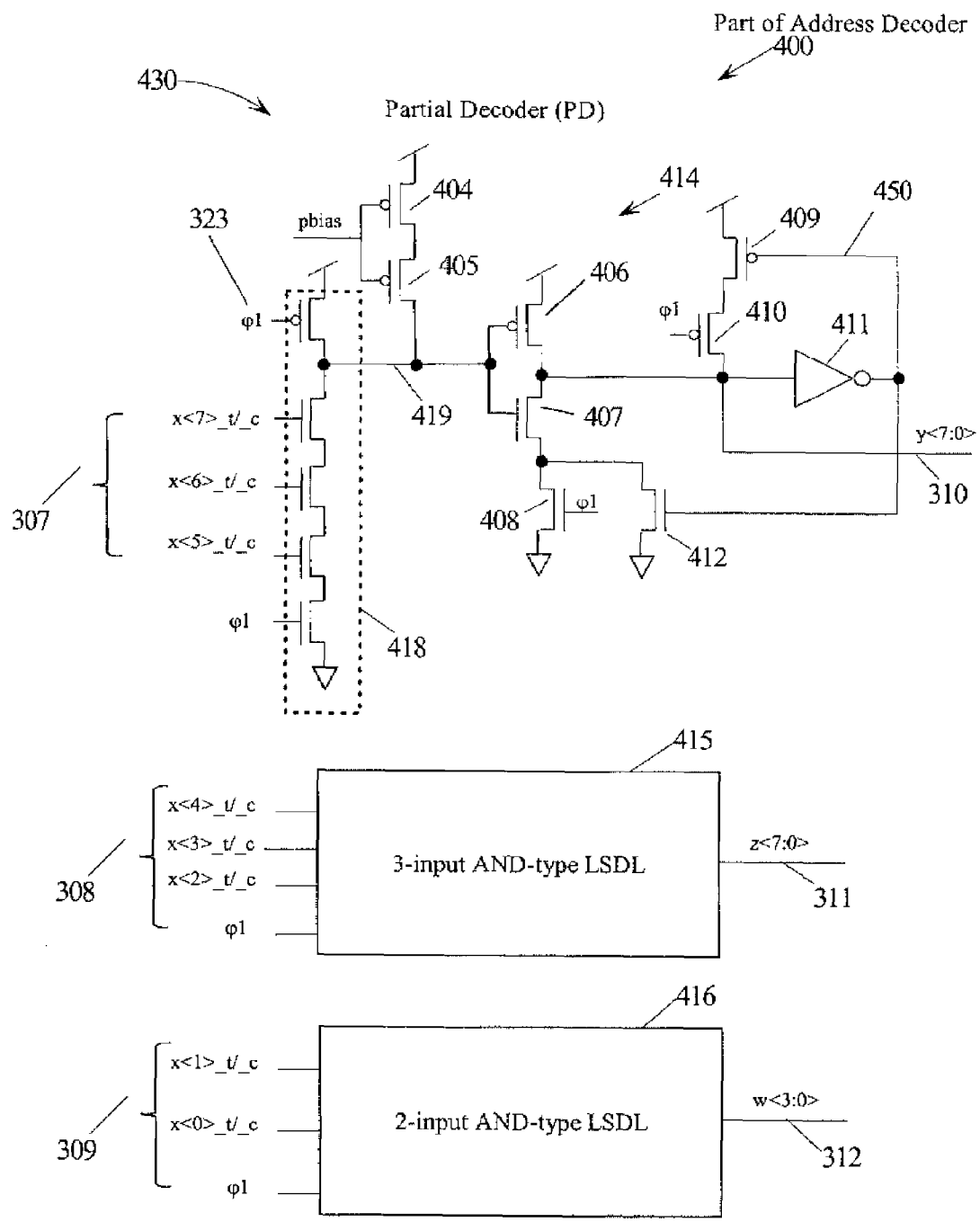
FIG. 4B is another circuit diagram of a word line driver.

FIGS. 4A-4C illustrate an address decoder 400 that uses LSDL logic with the NAND functionality described relative to FIGS. 3B and 3C. While this circuitry is faster than the static circuitry of FIGS. 3B and 3C, it still suffers the speed degradation of 3 and 4-stage cascaded NMOS devices in the NAND logic gates.

FIG. 4A is a circuit diagram illustrating a static logic true/complement logic generator for producing 8 true address bits x<7:0>_t 306 and 8 complement address bits x<7:0>_c 305. FIG. 4A implies that there are 8 sets of inverters 402, 302, and 303, coupled as shown, each receiving an address bit and generating its true state and its complement state. Exemplary circuitry (inverters 402, 302, and 303) receives a<7:0> 304 and outputs true address bits x<7:0>_t 305 and complement address bits x<7:0>_c 306. Three inverters are used in the configuration of to assure that the gates generating both the true and complement signal are equally loaded.

FIG. 4B is a circuit diagram of a PD 430 implemented using LSDL logic circuitry that performs an AND function and has both true and complement outputs even though only the true (AND) output is needed for this application. One block of the partial decoder 430 is used to explain the operation of the particular LSDL circuitry used relative to FIG. 4B.

Logic tree 418 performs the NAND function and comprises 4 NFETs, one gated by clock phase 323 and three gated by the high order true and complement address bits 307 (x<7:5>_t and x<7:5>_c) from TCG 401. PFETs 404 and 405 bias the dynamic node 419 in response to bias signal pbias 403 which is used to compensate for leakage. The circuitry comprising NFETS 407-408 and 412, inverter 411, and PFETS 409-410 operate to latches states of the dynamic node 419 to true output 310 (AND) and complementary output 451 (NAND).

The 3-input AND gate 415 and 2-input AND gate 416 produce the other bit groups. LSDL circuitry 414 produces the bit group y<7:0> 310 from the true and complement address bits 307. LSDL AND circuitry 415 receives true and complement address bits 308 and produces bit group z<7:0> 311 and LSDL AND circuitry 416 receives true and complement address bits 309 and produces bit group w<3:0> 312. As before, the product of the number of bits in the bit groups is 256.

FIG. 4C is a Domino type WL Drivers 440 that produces the 256 word lines WL<0:255> 422. NAND gate 420 and inverter 421 are one of 256 circuits needed to produce the word lines WL<0:255> 422. In this manner, the combinations 450 comprising y<7:0> 310, z<7:0> 311, w<3:0> 312 generate the 256 word lines WL<0:255> 422 for addressing 256 registers.

Since LSDL circuits 414-416 evaluate to a logic state during one phase of the clock (e.g. clock 323) and hold the latched states for the second pre-charge phase, an LSDL circuit output is valid for most of an entire clock cycle. This feature is not desirable for generating word-lines because pipeline architecture requires the WL Drivers to be valid or gated ON for only one half of the clock cycle. For this reason a second clock 423 that is shifted 180 degrees from clock 323 is required for the WL Drivers 440

Using LSDL for the partial decoder 430 and the WL Driver 440 improves speed but requires an additional clock phase 423. The NAND type dynamic logic gates require four series connected NFET devices which limit their performance.

Figure 5A:
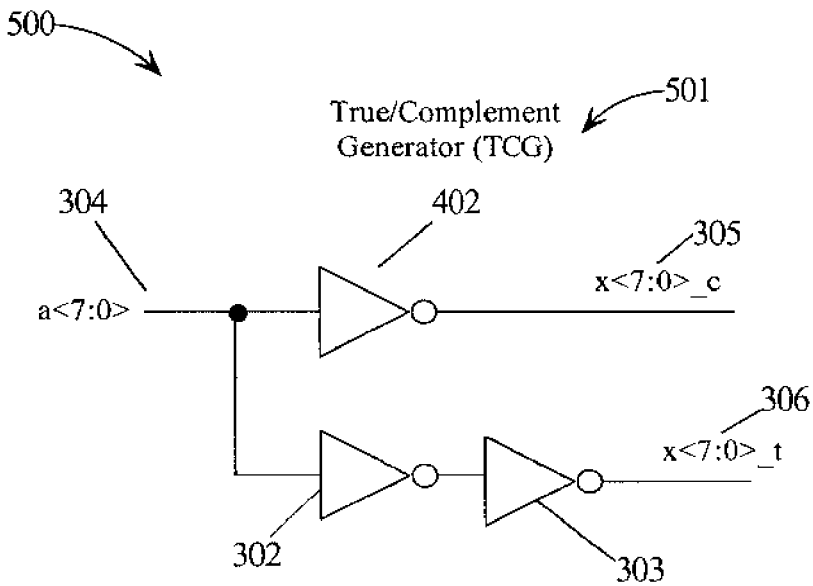
FIG. 5A is a circuit of a true-complement generator suitable for use with the present invention.
Figure 5C:
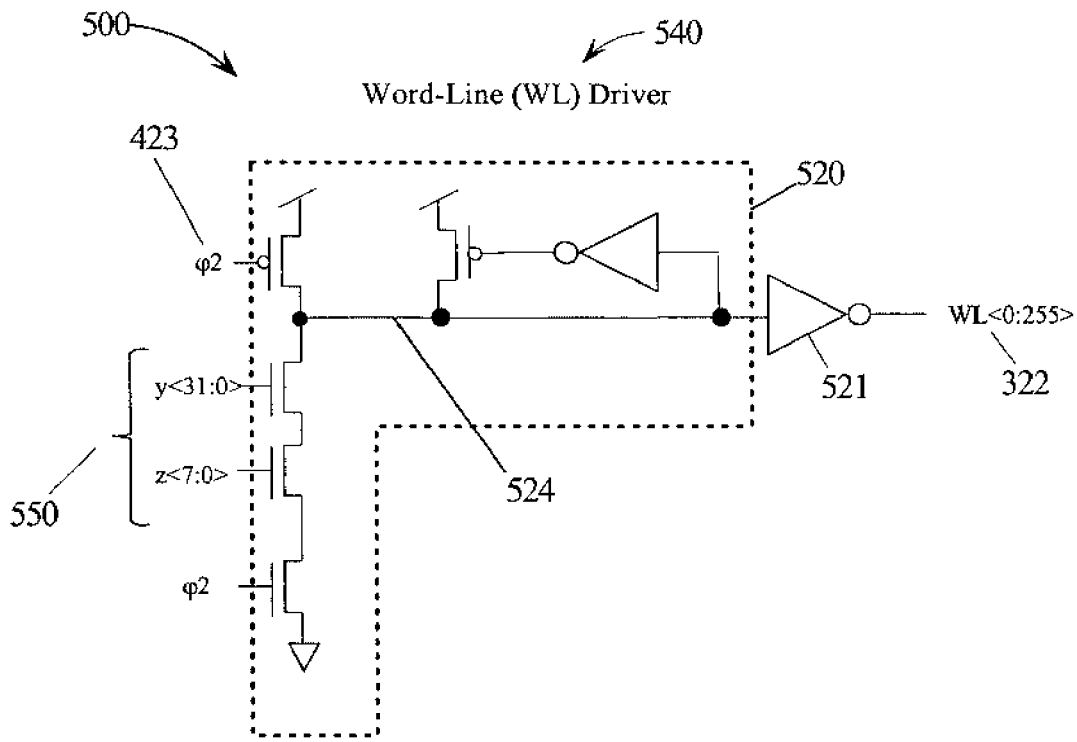
FIG. 5C is a circuit block diagram of circuits in another partial decoder.
Figure 5B:
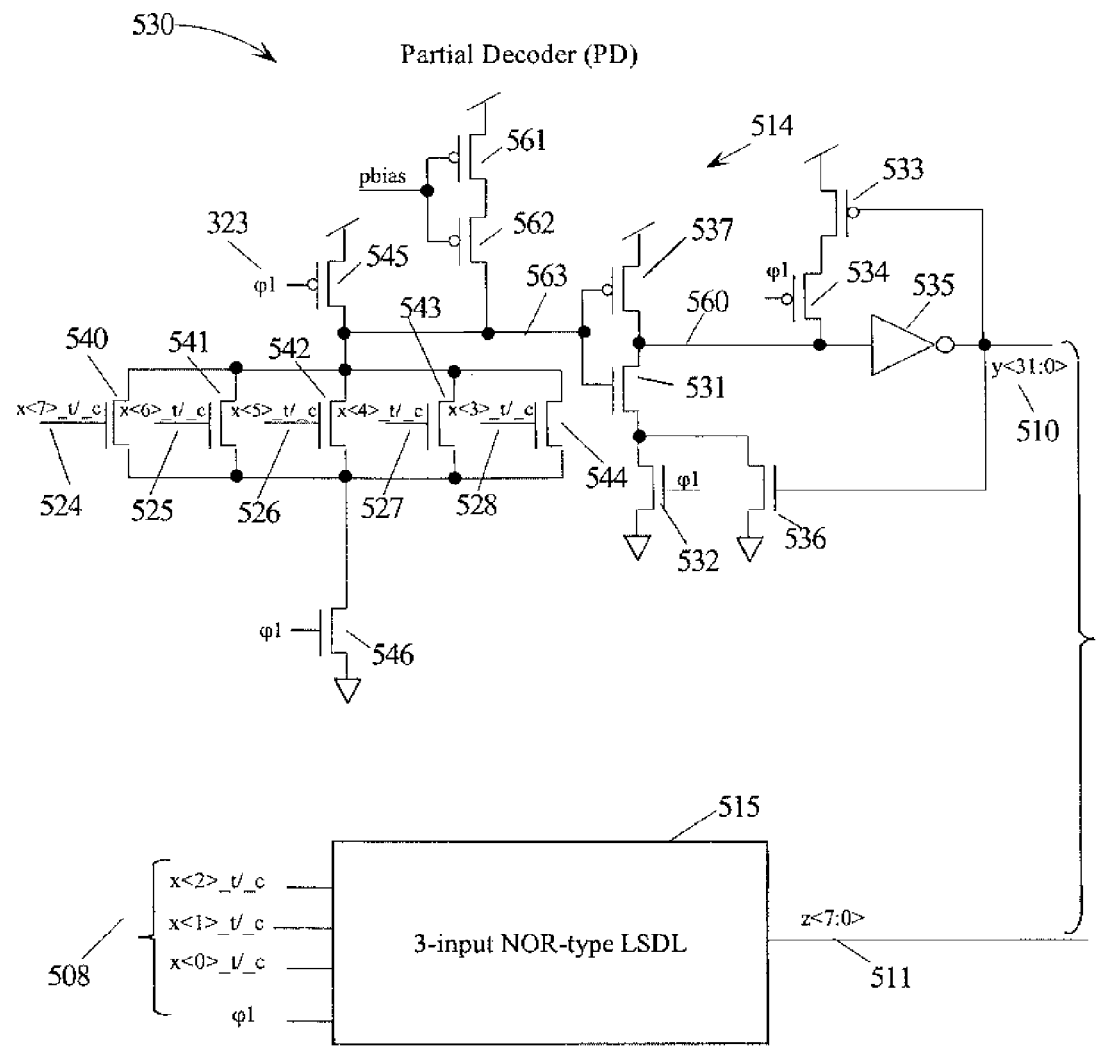
FIG. 5B is another circuit diagram of a word line driver.

FIGS. 5A-5C illustrate circuitry of an Address Decoder 500 that uses LSDL logic with the NOR functionality to reduce the number of cascade NFET stages in the logic gates. Using NOR logic gates enables the bit groups to be reduced to two and thus assures no more than 2-cascade NFET stages in LSDL are needed in implementing address decoder 500. Address Decoder 500 comprises TCG 501 which is the same as TCG 401 described relative to FIG. 4A, NOR logic PD 530, and WL Driver 540 which has a logic AND functionality.

FIG. 5B illustrates circuitry of PD 530 using 32 LSDL circuits 514 and 8 LSDL circuits 515 to generate two bit groups; y<31:0> 510 and z<7:0> 511 from inputs x<7:3>_t/_c (524-528) and x<2:0>_t/_c 508 from TCG 501. Each one of the 32 LSDL circuits 514 receives a combination of the inputs x<7:3>_t/_c such that one of the 32 bits y<31:0> 510 is a logic one during the possible combinations of the inputs x<7:3>_t/_c. Likewise, each one of the 8 LSDL circuits 515 receives a combination of the inputs x<2:0>_t/_c such that one of the 8 bits z<7:0> 511 is a logic one during the possible combinations of the inputs x<2:0>_t/_c. Again the product of the 32 bits in 510 and the 8 bits in 511 is equal to 256, the number of word-lines fro an 8 bit binary address.

NFETS 540-544 provide the S-input NOR function at dynamic node 563. Selected ones of PFET 545 pre-charges node 563 when clock 323 is a logic zero. NFET 546 evaluates the states of the NOR NFETS 540-544 when clock 323 is a logic one. PFETS 561 and 562 compensate for leakage at node 563 in response to voltage pbias 521. The circuit comprising PFET 530 and NFETS 531 and 532 invert the state of node 523 when clock 323 is a logic one. If node 560 is a logic zero in response to an evaluation of node 563, then this logic zero state is latched by the action of inverter 535 and NFET 530 when the pre-charge on node 563 turns ON NFET 531 during a logic zero of clock 323. If node 560 is a logic one in response to an evaluation of node 563, then this logic one state is latched by the action of inverter 535 and PFETS 533 and 534 during a logic zero of clock 323. The functionality of LSDL circuit 514 from inputs comprising bits y<7:3>_t/_c 507 to the output y<31:0> 510 is a logic NOR.

If word-lines WL<0:255> 322 are to be positive true, then the inputs to LSDL circuits 514 and 515 must be selected to be negative true; when all inputs are a logic zero the output produces a logic one.

Each driver in WL Drivers 540 must have the functionality of a logic AND circuit from inputs 550 receiving y<31:0> 510 and z<7:0> 511 to the outputs of inverter 521 producing word-lines WL<0:255> 322. Since PD 530 comprises LSDL circuitry, a second clock phase 423 is necessary as described relative to FIG. 48. WL Drivers 540 are configured as a Domino logic circuit. When clock 423 is a logic zero, the circuitry of PD 530 is evaluated and latched by a logic one of clock 323. The logic zero of clock 423 charges the dynamic node 524. The states of the selected bits of y<31:0> 510 and z<7:0> 511 are evaluated when clock 423 is a logic one. Logic one states of the dynamic node 524 are latched by the half-latch comprising PFET 561 and inverter 560. Inverter 521 inverts the NAND dynamic node and produces an AND logic function for the WL Drivers 540.

The LSDL Address Decoder 500, while reducing the number of cascaded NFET devices to no more than 2, suffers from requiring two different clocks 323 and 423. Also, it is very difficult to match the arrival of the clock 423 with the outputs y<31:0> 510 and z<7:0> 511 of PD 530 at the WL Drivers 540 since clock 423 has a heavy capacitive load when driving all 256 of the WL Drivers 540.

Figure 6A:
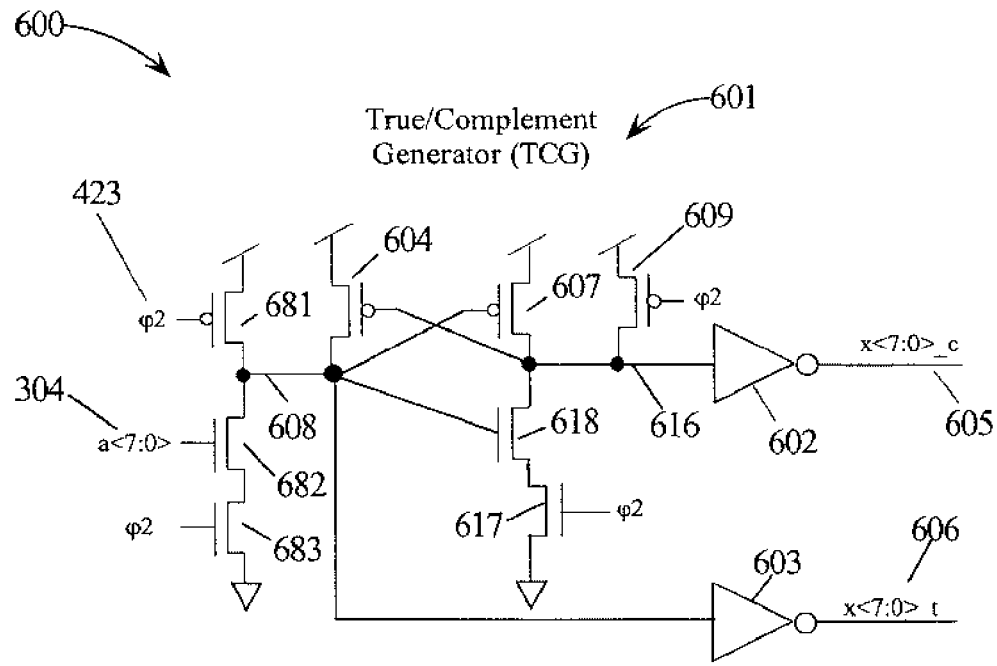
FIG. 6A is a circuit of a true-complement generator suitable for use with the present invention.
Figure 6C:
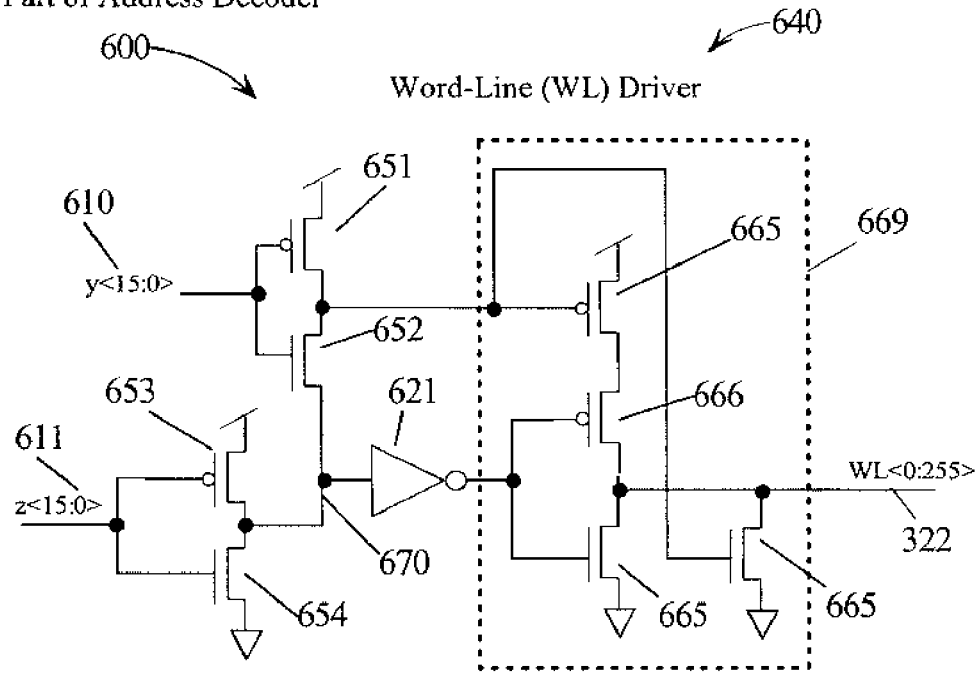
FIG. 6C is a circuit block diagram of circuits in another partial decoder.
Figure 6B:
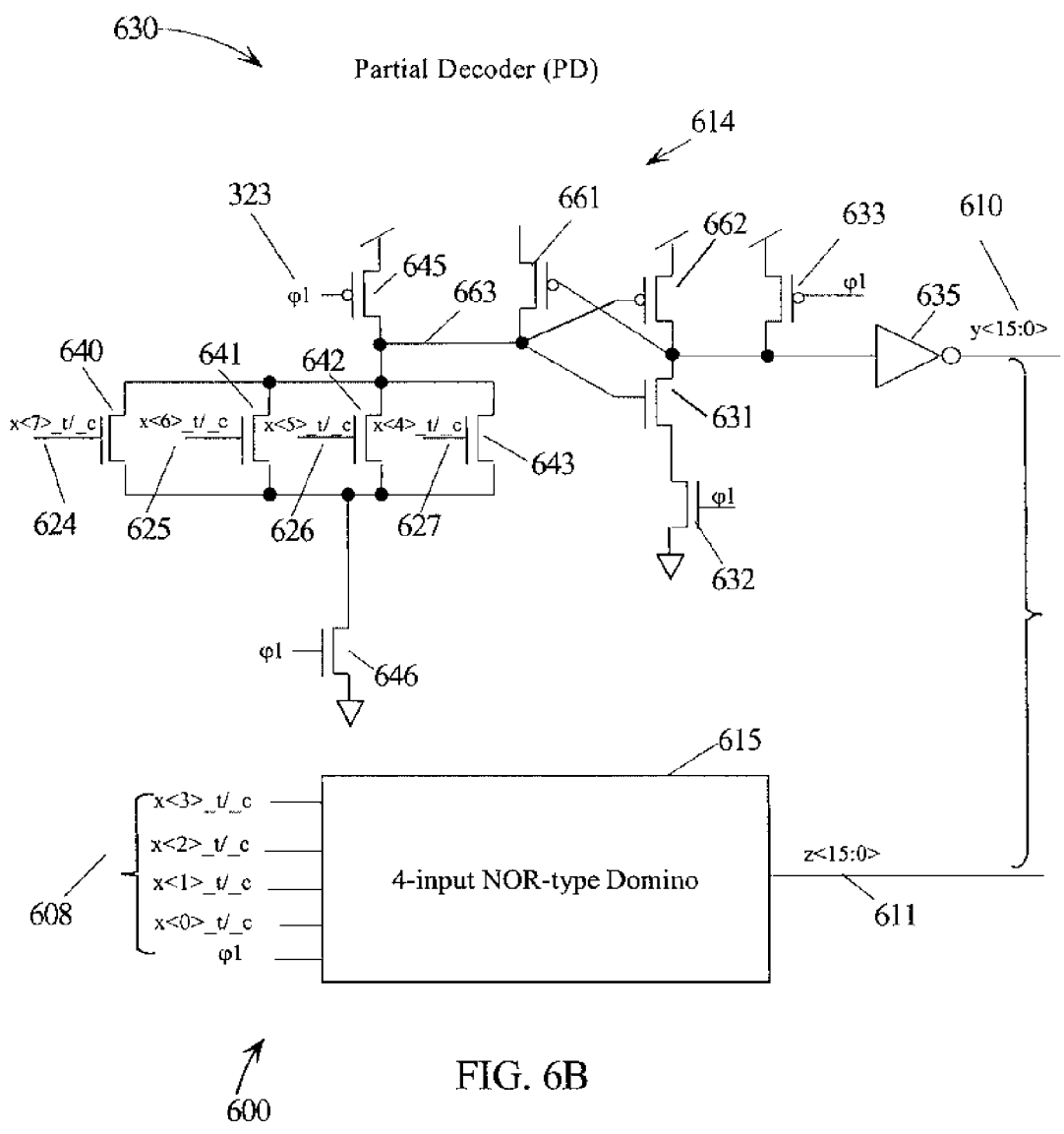
FIG. 6B is another circuit diagram of a word line driver.

FIGS. 6A-6C illustrate an Address Decoder 600 illustrating the use of Domino logic with the NOR functionality to reduce the number of cascade NFET stages in the logic gates. Address Decoder 600 comprises TCG 601, PD 630 and WL Drivers 640. Domino logic consumes more power than static logic or LSDL logic. Even though two clock phases are not used in PD 630 and WL Drivers 640, the use of a second phase 423 is desirable in TCG 601 to assure skew-less true address bits x<7:0>_t 606 and complement address bits x<7:0>_c 605. Domino logic does not latch states of the outputs when clock 323 is in the pre-charge state, therefore skew-less true address bits x<7:0>_t 606 and complement address bits x<7:0>_c 605 are important.

The TCG 601 has an input stage that is clocked with clock 423 to produce logic states at dynamic node 608. When clock 423 is a logic one, it evaluates a logic state from address bits a<7:0> 304. When dynamic node 608 remains at a logic one after evaluation, no skew exists between a true output x<7:0>_t 606 and complement output x<7:0>_c 605. However, when node 608 evaluates to a logic zero, then a true output x<7:0>_t 606 will transition to a logic one and a complement output x<7:0>_c 605 will transition to a logic zero which results in a potential skew situation. When node 608 evaluates to a logic zero, there is contention between PFET devices 604 and 607 to set the potential at nodes 608 and 616. Inverters 602 and 603 are optimized to correct for any differing skew between a true output x<7:0>_t 606 and a complement output x<7:0>_c 605. PFET 609 pre-charges node 616 and NFETS 617 and 618 evaluate node 616 when clock 623 transitions to a logic one.

Using NOR Domino logic gates enables the bit groups to be reduced to two and thus assures no more than 2-cascade NFET stages are needed in implementing address decoder 600. In FIG. 6B, PD 630 illustrates one of 32 Domino logic circuit that generates two 16 bit groups; y<15:0> 610 and z<15:0> 611 from inputs x<7:4> 508 and x<3:0> 611 respectively.

Referring to FIG. 6B, NFETS 640-643 provide the 4-input NOR function at dynamic node 663. PFET 645 pre-charges node 663 when clock 323 is a logic zero. NFET 646 evaluates the states of the of the NOR NFETS 640-643 when clock 323 is a logic one. PFET 661 holds up the dynamic node 663 when it evaluates to a logic one. The circuit comprising PFET 662 and NFETS 631 and 632 invert the state of node 663 when clock 323 is a logic one. PFET 633 pre-charges node 660 when clock 323 is a logic zero and NFETS 631 and 632 evaluate node 660 in response to the evaluation of node 663. The functionality of Domino circuit 614 from inputs comprising bits y<7:4>_t/_c 607 to an output y<15:0> 610 is a logic NOR. If word-lines WL<0:255> 322 are to be positive true, then the inputs to Domino circuits 614 and 615 must be selected to be negative true; when all inputs are a logic zero the output produces a logic one.

FIG. 6C illustrates one of the WL Drivers 640. The output stage is a 2-input NOR gate comprising PFETs 665-666 and NFETS 667-668. One of the bits of y<15:0> 610 is coupled to the inverting stage comprising PFET 651 and NFET 652. The source of NFET 652 is configured as a common node. The circuitry comprising PFETs 652, 665-666, NFETS 652, 667-668, and inverter 621 is repeated 256 times and configured as 16 groups of 16 circuits, wherein the common node 670 of each group of 16 circuits are coupled together. There are 16 inverters comprising PFET 653 and NFET 654 each having an input coupled to one of the bits of z<15:0> 611 and a output coupled to one of the common nodes 670 in the 16 bit groups. When one of the bits of y<15:0> 610 is a logic one and one of the bits of z<15:0> 611 transitions to a logic one, one of the 256 word-lines 322 produces a logic one pulse determined by the delay through inverter 621.

Using all Domino logic for Address Decoder 600 requires two clock phases, has the high power dissipation of all Domino logic circuitry for PD 630, and the less than optimum WL Driver topology 640 wherein the pulse on selected WL<0:255> 322 may be difficult to control.

Figure 7A:
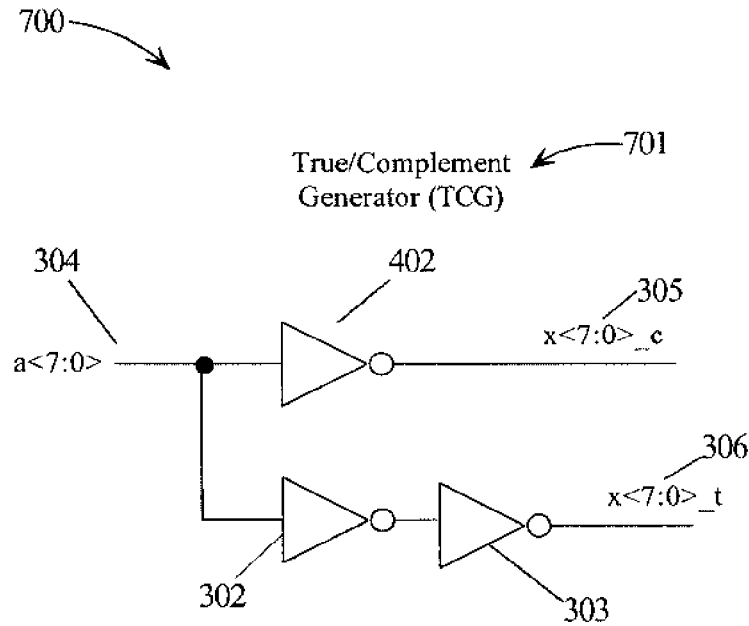
FIG. 7A is a circuit of a true-complement generator suitable for use with the present invention.
Figure 7C:
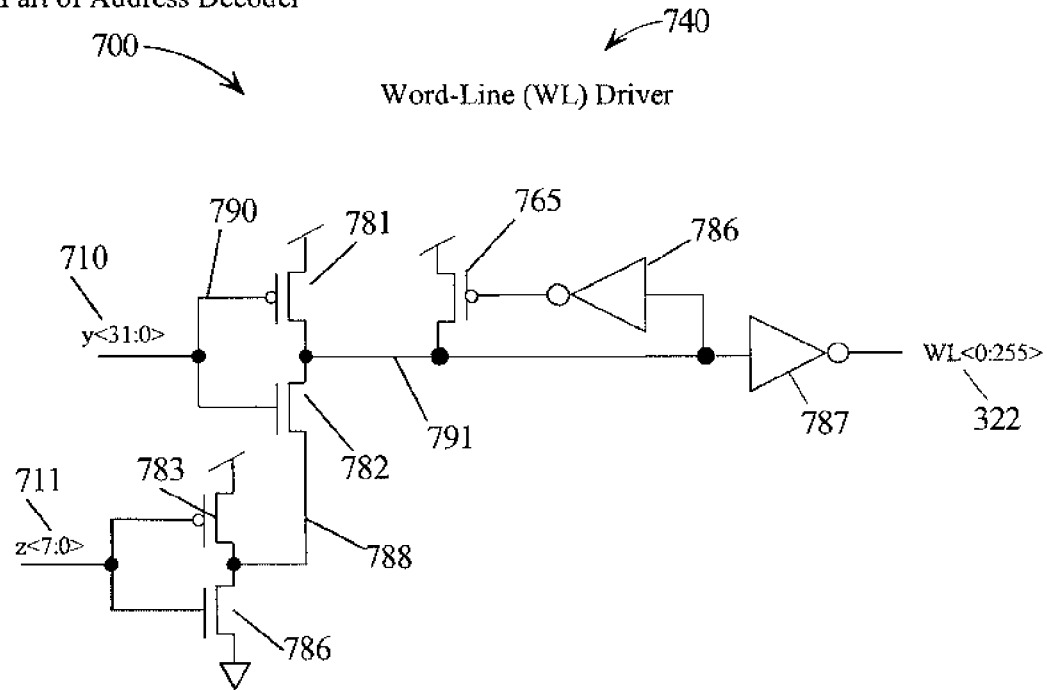
FIG. 7C is a circuit diagram of circuits in a partial decoder according to embodiments of the present invention.
Figure 7B:
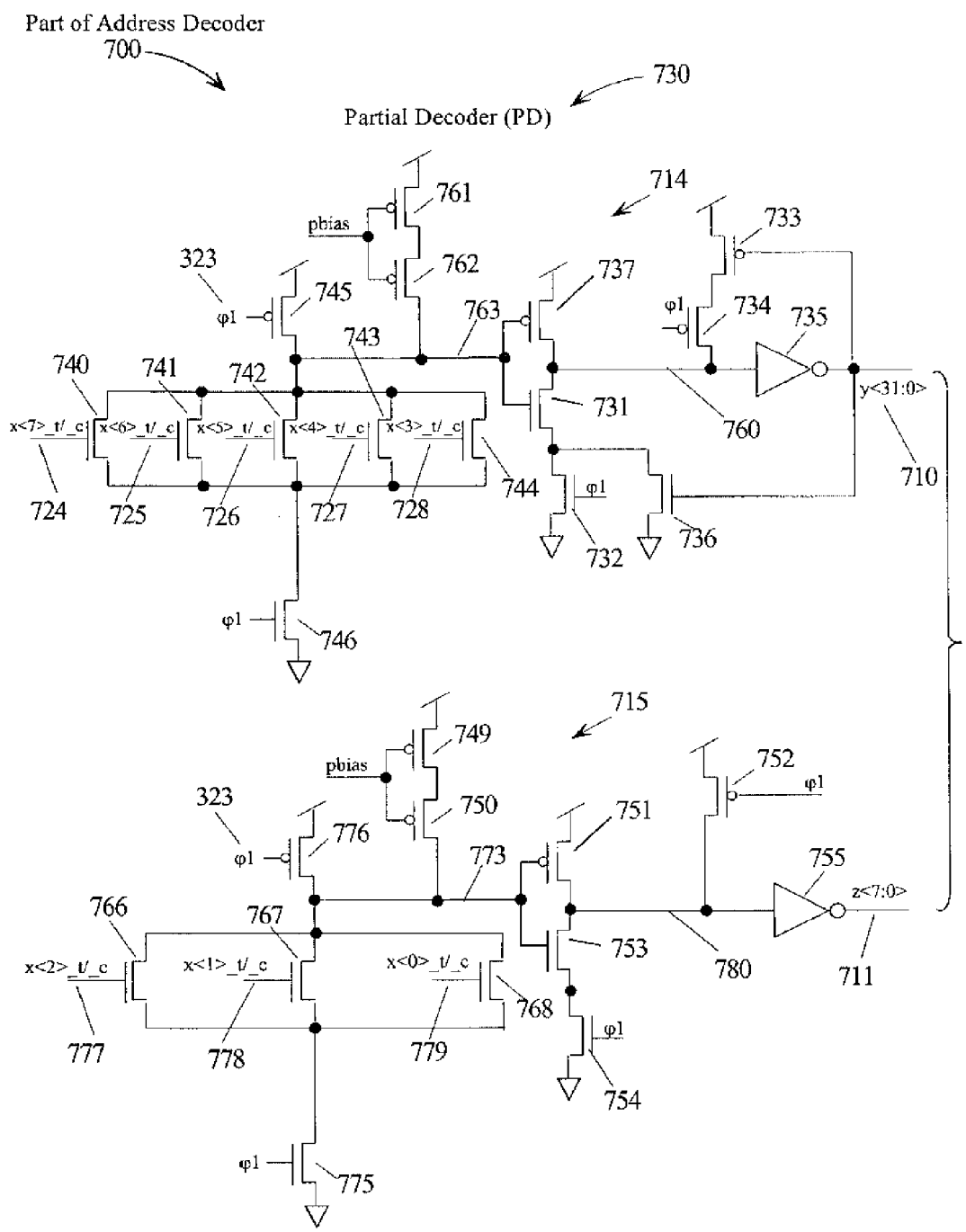
FIG. 7B is another circuit diagram of a word line driver according to embodiments of the present invention.

FIGS. 7A-7C are circuit diagrams for an Address Decoder 700 according to embodiments of the present invention. Address Decoder 700 comprises a TCG 701, a PD 730 and WL Drivers 740. Address Decoder 700 uses a combination of LSDL circuitry and Domino logic circuitry and exploits the strengths of each circuit type to implement address decoder 700 with improved ultra high speed performance.

FIG. 7A is the circuit diagram of 1 or 8 circuits receiving inputs a<7:0> 304 and generating outputs x<7:0>_c 305 and x<7:0>_t 306 "two fork" inverters 402 and 302-303. TCG 701 is the same as TCG 401 and is detailed relative to FIG. 4A.

FIG. 7B illustrates the circuitry used to implement a combination PD 730 according to embodiments of the present invention. PD 730 is partitioned into two bit groups one processing bits using LSDL logic and one using Domino logic. It is desirable to configure the partition to maximize the circuitry in LSDL to minimize the dynamic logic power since LSDL logic is more power efficient than Domino logic.

In address decoder 700, LSDL circuitry 714 comprises the devices receiving combinations of inputs from x<7:3>_t/_c (724-728) and generating outputs y<31:0> 710 wherein only one of the bits is a logic one during any one cycle of clock 323. Domino logic circuitry 715 comprises the devices receiving inputs from x<2:0>_t/_c 708 (777-7790 and generating outputs z<7:0> 711. Other partitions between the LSDL circuitry and the Domino circuitry may be chosen and are considered within the scope of the present invention.

NFETS 740-744 form the logic NOR function of the logic tree. PFET 746 pre-charges the dynamic node 763 when clock 323 is a logic zero and NFET 745 evaluates the logic states of inputs 724-728 when clock 323 is a logic one. PFETS 761 and 762 compensate dynamic node 763 for leakage losses in response to voltage pbias 721. PFETS 733-734 and NFETS 732-736, and inverter 735 form the static latch portion of LSDL circuitry in each bit of bit group 714. Operation of LSDL is detailed relative to FIG. 5B. The LSDL circuitry 714 has valid outputs for nearly the entire cycle of clock 323 and normally would require the corresponding WL Driver (e.g., 740) that it drives to be clocked by the complement of clock 323 so that the WL Driver outputs 322 would be gated valid for only one half cycle for desired pipeline operation. To solve this problem, the present invention implements the second bit group 715 using Domino logic which is only valid when the clock 323 is a logic one.

Each bit of bit group 715 is implemented as a Domino logic 3-input NOR with negative true inputs. In this example, combinations of the inputs x<2:0>_t/_c are used to generate 8 bits z<7:0> wherein only one of the bits is a logic one during any positive half cycle of clock 323. The outputs z<7:0>, therefore, are operable to become a de-facto clock for a following WL Drivers (e.g., WL Drivers 740). NFETS 766-768 form the 3-input NOR of the logic tree of the Domino logic circuitry. PFET 776 pre-charges node 773 to a logic one when clock 323 is a logic zero. NFET 775 evaluates the logic states of selected inputs x<2:0> 708 at node 773. PFETS 749-750 compensate for leakage at node 773 in response to pbias 721. NFET 753 and PFET 751 evaluate dynamic node 780 when clock 323 is a logic one. PFET 752 forces node 780 to a logic one and thus all outputs z<7:0> 711 to a logic zero when clock 323 is a logic zero. Thus, any output z<7:0> 711 that evaluates to a logic one is only active while clock 323 is a logic one.

Referring to FIG. 7C, WL Drivers 740 are 256 logic AND circuits receiving a inputs z<7:0> 711 and y<31:0> 710 and generating 256 outputs only one of which is a logic one during the logic one half cycle of clock 323 because of the characteristics of bits z<7:0> 711 generated by Domino circuitry 715. WL Drivers 740 are configured as 8 groups of 32 circuits each comprising PFETS 781 and 765, NFET 782 and inverters 766-767 wherein each of the 32 circuits has an input 790 that receives one of the bits of y<31:0> 710 and a common input 768. The common node 768 of the 32 circuits in the 8 groups is coupled via an inverting circuit comprising PFET 783 and NFET 786 to a same one of the bits of z<7:0> 711. When a bit of z<7:0> 711 is a logic one, then the corresponding common node 768 is pulled to a logic zero by NFET 786. Whichever bit of y<31:0> 710 is a logic one will turn ON corresponding NFET 782 pulling node 791 to a logic zero and its output in WL<0:255> 322 will transition to a logic one for the time period clock 323 is a logic one. Since z<7:0> 711 has 8 logic one combinations and y<31:0> 710 has 32 logic one combinations, there are 256 possible word-line logic one combinations.

There are 8 inverters comprising an NFET 786 and a PFET 783 each coupled to one of the 8 bits of z<7:0> 711. To select a word-line, NFET 786 must pull the common node 768 to a logic zero. Common node 768 is coupled to 32 NFETS 782 and thus NFET 786 must be a large device to handle the capacitive load. However, having the common node improves layout and results in better performance than would result if there were 32 individual NFETS in the 32 WL Drivers in each group.

Embodiments of the present invention exploit the combined characteristics of LSDL and Domino logic to configure an address decoder 700 that requires only one clock phase 323, has no more that two cascaded NFET devices in the logic tree, and minimizes the power of the dynamic logic gates required to achieve a desired ultra high speed performance.

Figure 7D:
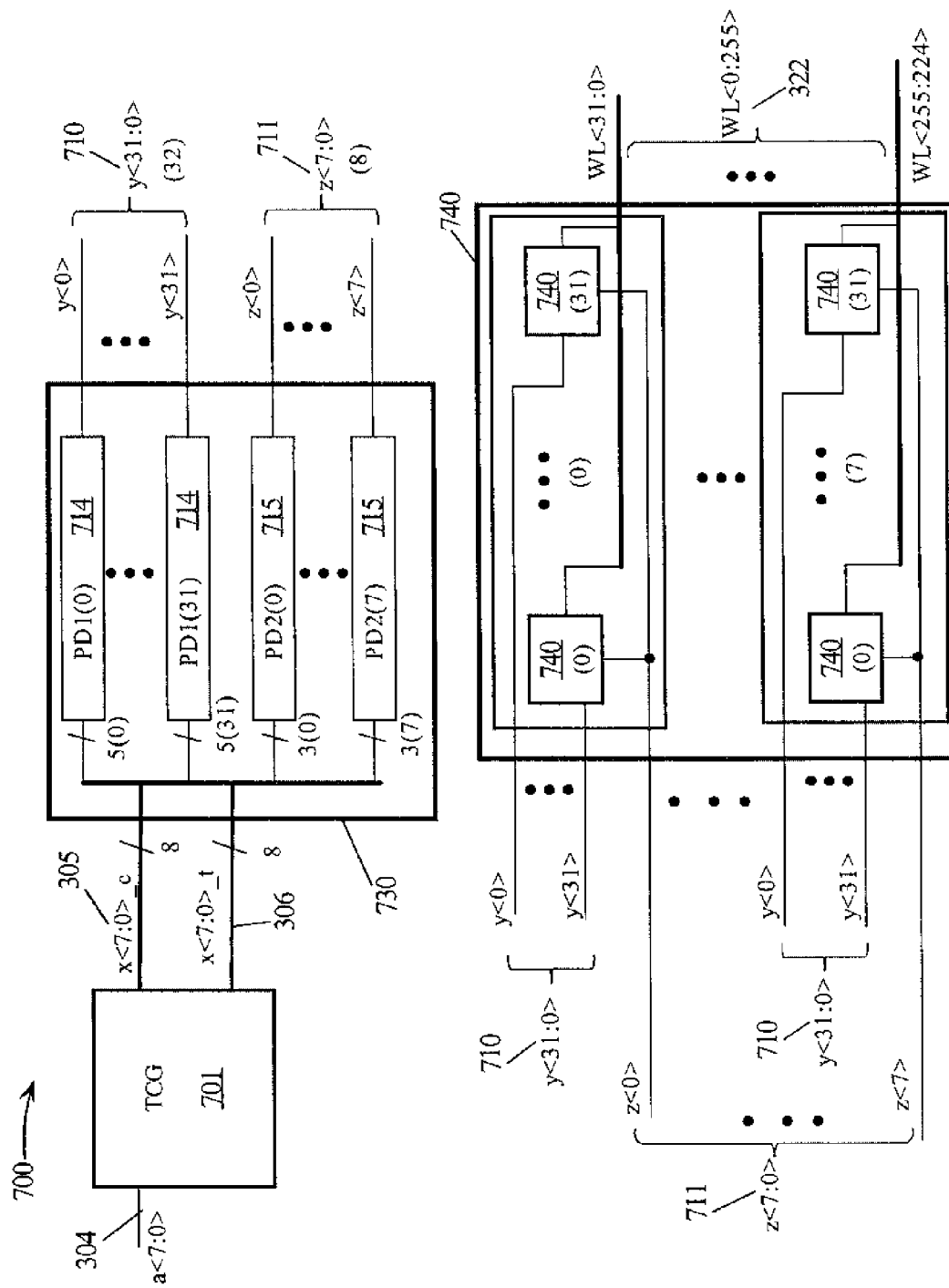
FIG. 7D is a block diagram illustrating how address decoder 700 is configured.

FIG. 7D is a block diagram illustrating how the circuitry in FIGS. 7A-7C is interconnected to make address decoder 700 according to embodiments of the present invention. TCG 701 receives 8 address bits a<7:0> and produces 8 complement bits x<7:0>_c 305 and 8 true bits x<7:0>_t 306. The true and complement bits are coupled to partial address decoder 730 which has 32 circuits 714 (PD1(0)-PD1(31)) and 8 circuits 715 (PD2(0)-PD2(7)). Each of the PD1 714 circuits receives one of 32 sets of 5 bits from x<7:0>_c 305 and x<7:0>_t 306. These sets of 5 bits are chosen such that they generate only one logic true state in the 32 output bits y<31:0>. Likewise, each of the PD2 715 circuits receives one of 8 sets of the remain 3 bits from x<7:0>_c 305 and x<7:0>_t 1306. These sets of 3 bits are chosen such that they generate only one logic true state in the 8 output bits z<7:0>. The combination of outputs y<31:0> 710 and z<7:0> 711 represents the 256 possible addresses that can be generated with an 8 bit address a<7:0> 304.

Outputs y<31:0> 710 and z<7:0> 711 are coupled to WL drivers 740. WL drivers 749 are configured as 8 rows of 32 circuits 740. Each of the 32 circuits 740 has an input coupled to a different one of the 32 bits y<31:0> 710 and a common input coupled to one of the 8 bits z<7:0> 711. Each row generates 32 word lines gated by one of the bits z<7:0> 711. A general Row (j) of 740 comprises 32 circuits 740 each receiving one of bits y<31:0> 710 and z<j> and generating word lines WL<j+31:j>. The 8 rows produce 256 address lines WL<0:255> wherein only one of the word lines is a logic true.

Figure 8:
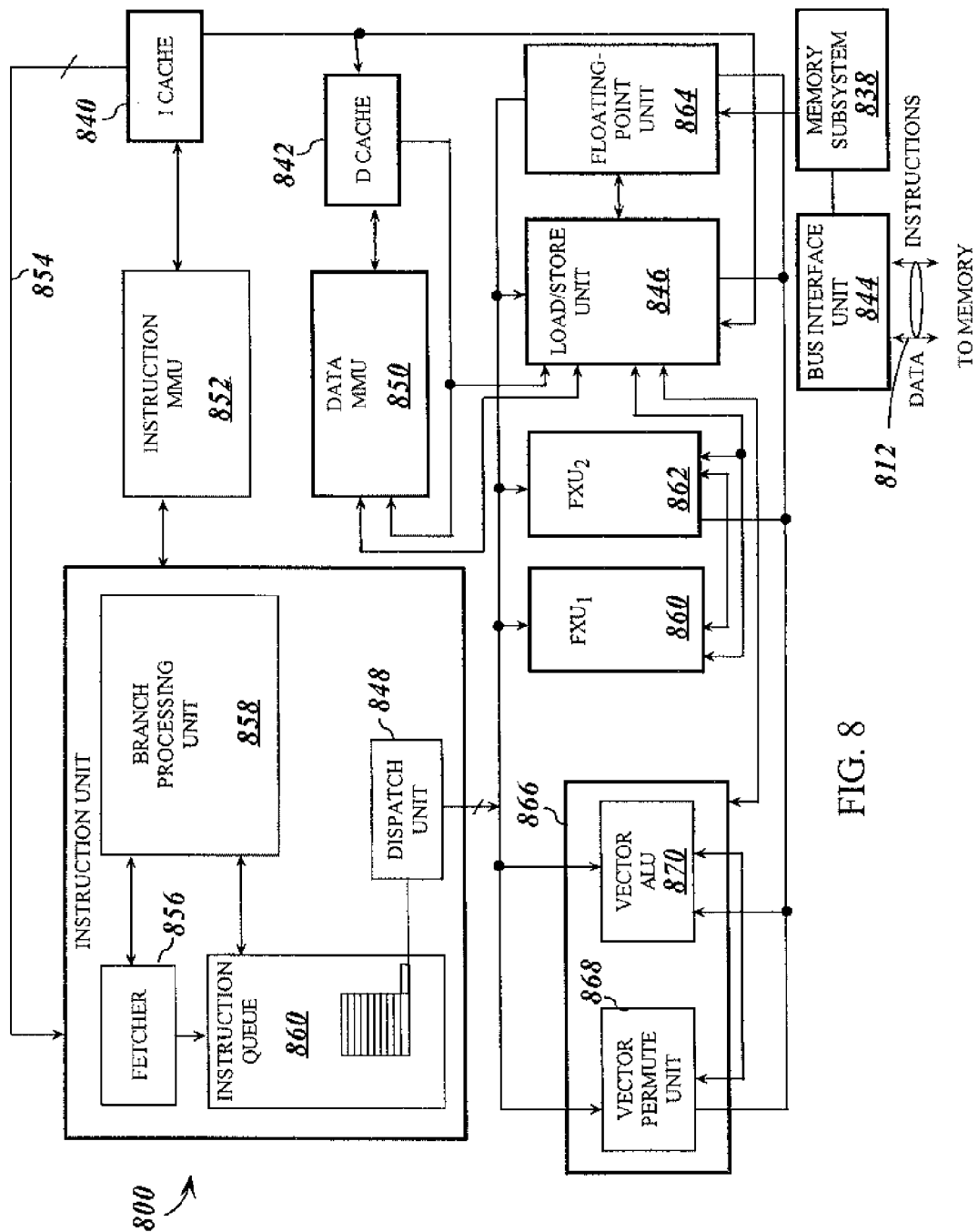
FIG. 8 illustrates a high level block diagram of selected operational blocks within a central processing unit (CPU) incorporating the present inventive principles.

FIG. 8 is a high level functional block diagram of selected operational blocks that may be included in a central processing unit (CPU) 800. In the illustrated embodiment, CPU 800 includes internal instruction cache (I-cache) 840 and data cache (D-cache) 842 which are accessible to memory (not shown in FIG. 8) through bus 812, bus interface unit 844, memory subsystem 838, load/store unit 846 and corresponding memory management units: data MMU 850 and instruction MMU 852. In the depicted architecture, CPU 800 operates on data in response to instructions retrieved from I-cache 840 through instruction dispatch unit 848. Dispatch unit 848 may be included in instruction unit 854 which may also incorporate fetch unit 856 and branch processing unit 858 which controls instruction branching. An instruction queue 860 may interface fetch unit 856 and dispatch unit 848. In response to dispatched instructions, data retrieved from D-cache 842 by load/store unit 846 can be operated upon by one of fixed point unit (FXU) 860, FXU 862 or floating point execution unit (FPU) 864. Additionally, CPU 800 provides for parallel processing of multiple data items via vector execution unit (VXU) 866. VXU 866 includes vector permute unit 868 which performs permutation operations on vector operands, and vector arithmetic logic unit (VALU) 870 which performs vector arithmetic operations, which may include both fixed-point and floating-point operations on vector operands. CPU 800 may have registers and other circuits that may be addressed using an Address Decoder 700 according to embodiments of the present invention to improve overall processor performance.

Figure 9:
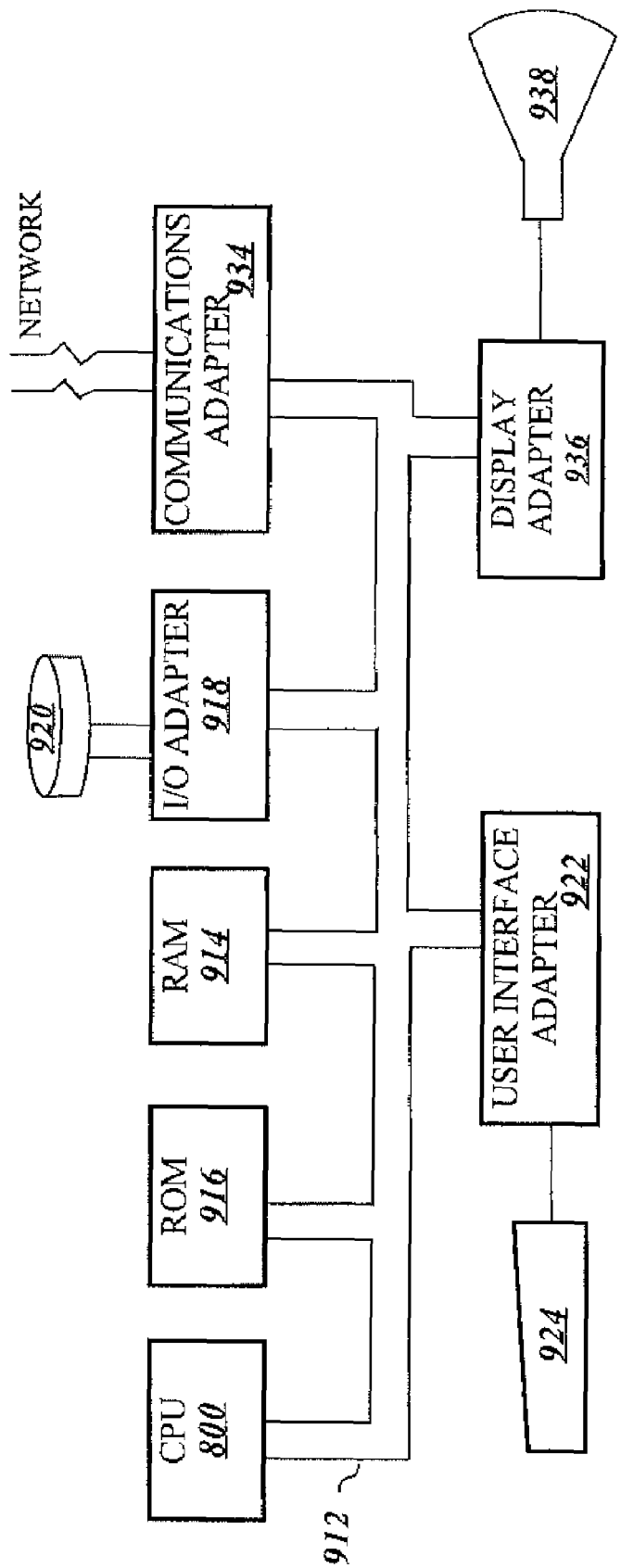
FIG. 9 illustrates a data processing system incorporating a CPU according to the present inventive principles.

A representative hardware environment 900 for practicing the present invention is depicted in FIG. 9, which illustrates a typical hardware configuration of a data processing system in accordance with the subject invention having CPU 800, incorporating an Address Decoder 700 according to the present inventive principles, and a number of other units interconnected via system bus 912. The data processing system shown in FIG. 9 includes random access memory (RAM) 914, read only memory (ROM) 916, and input/output (I/O) adapter 918 for connecting peripheral devices such as disk units 920 to bus 912, user interface adapter 922 for connecting keyboard 924, mouse 926, and/or other user interface devices such as a touch screen device (not shown) to bus 912, communication adapter 934 for connecting the system to a data processing network, and display adapter 936 for connecting bus 912 to display device 938. Note that CPU 800 may reside on a single integrated circuit.

Although the present invention and its advantages have been described in detail, it should be understood that various changes, substitutions and alterations can be made herein without departing from the spirit and scope of the invention as defined by the appended claims.

What is claimed is:

1. An ultra high speed address decoder comprising:
a number P first dynamic NOR logic gates each having a number M inputs coupled to one of a number P unique sets of M bits selected from a number N true and N complements of the N address bits and an output generating one of P bits of a first bit group having P unique combinations of one bit with a logic true state, wherein the first dynamic NOR logic gates have a dynamic node that is pre-charged when a clock signal has a logic zero state and evaluated to a Boolean combination of the M bits coupled to its inputs and a logic state of the output is latched when the clock signal has a logic one state;
a number K second dynamic NOR logic gates each having (N–M) inputs coupled to one of K unique sets of (N–M) bits selected from the N true address bits and the N complements address bits and an output generating one of K bits of a second bit group having K unique combinations of one bit with a logic true state, wherein the second dynamic NOR logic gates have a dynamic node that is pre-charged when the clock signal has a logic zero state and evaluated to a Boolean combination of the (N–M) bits coupled to its inputs and a logic state of the output is evaluated to the logic state of the dynamic node when the clock signal has the logic one state and the output is a logic zero when the clock signal has the logic one state; and
a number $2^N$ word-line drivers partitioned into K groups of P first circuits each having an input coupled to one of the P bits of the first bit group, a common input, and an output generating one of the $2^N$ word-lines and K second circuits each having an input coupled to one of the K bits from the second bit group and an output coupled to the common input of the P first circuits in a corresponding one of the K groups, wherein P times K is equal to $2^N$.

2. The address decoder of claim 1, wherein $2^M$ equals P and $2^{N-M}$ equals K.

3. The address decoder of claim 2, wherein P is greater than K.

4. The address decoder of claim 3, wherein the P dynamic NOR gates are limited switch dynamic logic (LSDL) NOR gates.

5. The address decoder of claim 3, wherein the K dynamic NOR gates are Domino logic NOR gates.

6. The address decoder of claim 2, wherein the N true address bits and the N complement address bits are generated by a true/complement generator having N address circuits each having an input coupled to one of the N address bits and a first output generating one of the N true address bits and a second output generating one of the N complement address bits such that a skew between a logic transition of an true address bit is minimized relative to a logic transition of a corresponding complement address bit.

7. The address decoder of claim 2, wherein each of the P first circuits of the word-line drivers comprise:
a first inverting circuit having a logic input coupled to one of the P bits from the first bit group, an output, and the common node, wherein the output is a logic one when the logic input is a logic zero and the output is a logic zero when the logic input is a logic one and the common node is coupled to a logic zero state;
a second inverting circuit having an input coupled to the output of the first inverting circuit and an output coupled as one of the $2^N$ word-lines; and
a keeper circuit for holding a logic true state at the input of the second inverting circuit when the output of the first circuit when the clock is a logic zero.

8. The address decoder of claim 7, wherein each of the second circuits is a logic inverter having an input coupled to one of the K bits from the second bit group and a output coupled to the common node of the P circuits in one of the K groups.

9. The address decoder of claim 4, wherein the LSDL NOR logic gate comprises:
an M input NOR dynamic logic gate having a dynamic node pre-charged to a logic one when the clock is a logic zero and evaluated to a Boolean NOR combination of logic states at the M inputs when the clock is a logic one;
a latch circuit having an input coupled to the dynamic node and an output coupled as one of the P bits of the first bit group, wherein the state of the dynamic node is latched at the output when the clock signal is a logic one and the latched state is held at the output when the clock is a logic zero.

10. The address decoder of claim 5, wherein the Domino logic NOR gate comprises:
an (N–M) input NOR dynamic logic gate having a dynamic node pre-charged to a logic one when the clock is a logic zero and evaluated to a Boolean NOR combination of logic states at the M inputs when the clock is a logic one;
a gated circuit having an input coupled to the dynamic node and an output coupled as one of the K bits of the second bit group, where the output transitions to the state of the dynamic node when the clock is a logic one and the output is gated to a logic zero state when the clock is a logic zero.

11. The address decoder of claim 9, wherein the LSDL NOR gates further comprise a bias circuit for coupling current to its dynamic node in response to bias voltage.

12. The address decoder of claim 10, wherein the Domino logic NOR gates further comprise a bias circuit for coupling current to its dynamic node in response to bias voltage.

13. A central processing unit (CPU) comprising:
digital processing circuitry for processing digital data,
a memory for storing data and program instructions;
$2^N$ registers each selected by one of $_2$N word lines having a logic one state; and
an ultra high speed address decoder receiving a number N true address bits and N complement address bits and generating the $2^N$ word lines and having a number P first dynamic NOR logic gates each having a number M inputs coupled to one of P unique sets of M bits selected from the N true and N complements address bits and an output generating one of P bits of a first bit group having P unique combinations of one bit with a logic true state, wherein the first dynamic NOR logic gates have a dynamic node that is pre-charged when a clock signal has a logic zero state and evaluated to a Boolean combination of the M bits coupled to its inputs and a logic state of the output is latched when the clock signal has a logic one state, a number K second dynamic NOR logic gates each having (N−M) inputs coupled one of K unique sets of (N−M) bits selected from the N true address bits and the N complements address bits and an output generating one of K bits of a second bit group having K unique combinations of one bit with a logic true state, wherein the second dynamic NOR logic gates have a dynamic node that is pre-charged when the clock signal has a logic zero state and evaluated to a Boolean combination of the (N−M) bits coupled to its inputs and a logic state of the output is evaluated to the logic state of the dynamic node when the clock signal has the logic one state and the output is a logic zero when the clock signal has the logic one state, and a number $2^N$ word-line drivers partitioned into K groups of P first circuits each having an input coupled to one of the P bits of the first bit group, a common input, and an output generating one of the $2^N$ word-lines and K second circuits each having an input coupled to one of the K bits from the second bit group and an output coupled to the common input of the P first circuits in a corresponding one of the K groups, wherein P times K is equal to $2^N$.

14. The address decoder of claim 13, wherein $2^M$ equals P and $2^{N-M}$ equals K.

15. The address decoder of claim 14 wherein P is greater than K.

16. The address decoder of claim 15, wherein the P dynamic NOR gates are limited switch dynamic logic (LSDL) NOR gates.

17. The address decoder of claim 16, wherein the K dynamic NOR gates are Domino logic NOR gates.

18. The address decoder of claim 2, wherein the N true address bits and the N complement address bits are generated by a true/complement generator having N address circuits each having an input coupled to one of the N address bits and a first output generating one of the N true address bits and a second output generating one of the N complement address bits such that a skew between a logic transition of an true address bit is minimized relative to a logic transition of a corresponding complement address bit.

19. An ultra high speed address decoder for generating $2^N$ word-lines having a logic one state corresponding to one of $2^N$ unique combinations of a number N address bits comprising:
a true/complement generator (TCG) receiving the N address bits and generating N true address bits and N complement address bits;
a number P LSDL NOR logic gates each having M inputs coupled to one of P unique sets of M bits selected from the N address bits and N complement address bit and an output generating one of P bits of a first bit group having P unique combinations of one bit with a logic true state;
a number K Domino logic NOR gates each having (N−M) inputs coupled one of K unique sets of (N−M) bits selected from the N address bits and the N complements address hits and an output generating one of K bits of a second bit group having K unique combinations of one bit with a logic true state, and
a number $2^N$ word-line drivers partitioned into K groups of P first circuits each having an input coupled to one of the P bits of the first bit group, a common input, and an output generating one of the $2^N$ word-lines and K second circuits each having an input coupled to one of the K bits from the second bit group and an output coupled to the common input of the P first circuits in a corresponding one of the K groups, wherein P times K is equal to $2^N$.

20. The address decoder of claim 19, wherein $2^M$ equals P and $2^{N-M}$ equals K and P is greater than K.

* * * * *